(12) United States Patent
Cheng et al.

(10) Patent No.: US 10,996,308 B2
(45) Date of Patent: May 4, 2021

(54) APPARATUS AND METHOD FOR AUTHENTICATION OF ELECTRONIC DEVICE TEST STATIONS

(71) Applicant: ASM Technology Singapore Pte Ltd, Singapore (SG)

(72) Inventors: Chi Wah Cheng, Hong Kong (HK); Yu Sze Cheung, Hong Kong (HK)

(73) Assignee: ASM TECHNOLOGY SINGAPORE PTE LTD

(*) Notice: Subject to any disclaimer, the term of this patent is extended or adjusted under 35 U.S.C. 154(b) by 236 days.

(21) Appl. No.: 15/954,680

(22) Filed: Apr. 17, 2018

(65) Prior Publication Data

US 2019/0317174 A1 Oct. 17, 2019

(51) Int. Cl.
*G01R 35/00* (2006.01)
*G01R 1/04* (2006.01)
*G01R 31/28* (2006.01)

(52) U.S. Cl.
CPC ........... *G01R 35/00* (2013.01); *G01R 1/0408* (2013.01); *G01R 31/2834* (2013.01)

(58) Field of Classification Search
CPC ... G01R 35/00; G01R 1/0408; G01R 31/2834
USPC ...................................................... 324/750.2
See application file for complete search history.

(56) References Cited

U.S. PATENT DOCUMENTS 6,027,019 A * 2/2000 Kou .................... H05K 13/0452
235/375
6,137,303 A 10/2000 Deckert
7,369,237 B2 5/2008 Ikeno
9,423,420 B2 8/2016 Panagas
10,115,620 B2 10/2018 Cheung
10,656,206 B1* 5/2020 Patil .................... G01R 31/2834
2009/0224778 A1* 9/2009 Sato .................... G01R 31/2822
324/750.01

(Continued)

FOREIGN PATENT DOCUMENTS

CN 105983538 A 10/2016
TW 200540944 A 12/2005

(Continued)

OTHER PUBLICATIONS

Taiwan Office Action, dated Dec. 13, 2019, issued in corresponding Taiwanese Patent Application No. 108108763. English translation of Search Report. Total pages 10.

*Primary Examiner* — Farhana A Hoque
(74) *Attorney, Agent, or Firm* — Ostrolenk Faber LLP

(57) ABSTRACT

A testing apparatus and a method for testing electronic devices is provided. The apparatus comprising a plurality of detachably mountable test stations which are operative to perform tests on the electronic devices and a plurality of pick heads for conveying the electronic devices to at least one of the plurality of test stations for testing. The apparatus further comprises an identification element incorporated in each test station indicating a characteristic of the test station, and an identification element detector movable relative to the plurality of test stations, the identification element detector being operative to identify and authenticate the characteristic of the at least one test station by detecting the identification element incorporated in the test station, prior to utilizing the test station for testing the electronic devices.

17 Claims, 5 Drawing Sheets

(56) References Cited

U.S. PATENT DOCUMENTS

2015/0035541 A1* 2/2015 Ou Yang ............ G01R 31/2806
                                                    324/511
2015/0204943 A1* 7/2015 Yip .................... G01R 31/2891
                                                    324/750.22
2016/0216322 A1* 7/2016 Cheung .............. G01R 31/2893

FOREIGN PATENT DOCUMENTS

TW      201341803 A     10/2013
TW      201709377 A      3/2017

* cited by examiner

APPARATUS AND METHOD FOR AUTHENTICATION OF ELECTRONIC DEVICE TEST STATIONS

FIELD OF THE INVENTION

The present invention relates to an apparatus and method for identifying and authenticating electronic device test stations. In particular, the electronic device test stations are adapted for use in semiconductor device testing apparatus.

BACKGROUND

It is common to test electronic devices at various stages of their manufacturing processes, particularly before the completed electronic devices are sent out to customers. An electronic device under test would usually be placed in a test station which comprises electrical contact strips to electrically communicate with the electronic device under test. A testing module, which is connected to the test station, would run test program algorithms and provide appropriate electrical signals through the test station to test the electronic device. Thus, the test station acts as an intermediary between the electronic device under test and the testing module.

Hence, it should be appreciated that different types of electronic devices, or the same type of electronic device at different stages of manufacturing process, would require different types of test stations to allow communication between the electronic device under test and the testing module. In fact, different types of test stations would be required to cater for the different types of tests that may be performed on the same electronic device.

A human operator is usually tasked to match a specific test station and a particular test program to a certain electronic device under test. This has often proved to be a task that is prone to human error due to the fact that there are usually a large number of test stations and an even larger number of test programs available for selection. Furthermore, there may be serious consequences if a test station or test program is wrongly matched to the electronic device under test. False test results may be obtained, resulting in either good electronic devices being wrongly disposed of or faulty electronic devices being erroneously sent to customers. In addition, the test station and the electronic devices being tested may be damaged from being wrongly matched during testing.

Hence, it would be beneficial to seek to provide an apparatus and method which ameliorates at least some of the aforementioned problems of the prior art.

SUMMARY OF THE INVENTION

It is thus an object of this invention to seek to provide an apparatus and a method for automatically authenticating a test station and to ensure that it has been correctly installed.

According to a first aspect of the invention, there is provided a testing apparatus for testing electronic devices, the apparatus comprising a plurality of detachably mountable test stations which are operative to perform tests on the electronic devices; a plurality of pick heads for conveying the electronic devices to at least one of the plurality of test stations for testing; an identification element incorporated in each test station indicating a characteristic of the test station; and an identification element detector movable relative to the plurality of test stations, the identification element detector being operative to identify and authenticate the characteristic of the at least one test station by detecting the identification element incorporated in the test station, prior to utilizing the test station for testing the electronic devices.

According to a second aspect of the invention, there is provided a method for testing electronic devices, the method comprising the steps of: detachably mounting a plurality of test stations for performing tests on the electronic devices; moving an identification element detector relative to a respective identification element incorporated in each test station, each of the identification elements being indicative of a characteristic of the test station; detecting the identification element with the identification element detector to identify and authenticate the characteristic of the test station; conveying the electronic devices to at least one of the plurality of test stations with a plurality of pick heads; and thereafter testing the electronic devices at the at least one test station.

These and other features, aspects, and advantages will become better understood with regard to the description section, appended claims, and accompanying drawings.

BRIEF DESCRIPTION OF THE DRAWINGS

Embodiments of the present invention will now be described, by way of example only, with reference to the accompanying drawings, in which.

In the drawings, like parts are denoted by like reference numerals.

DETAILED DESCRIPTION OF THE PREFERRED EMBODIMENT OF THE INVENTION

Figure 1:
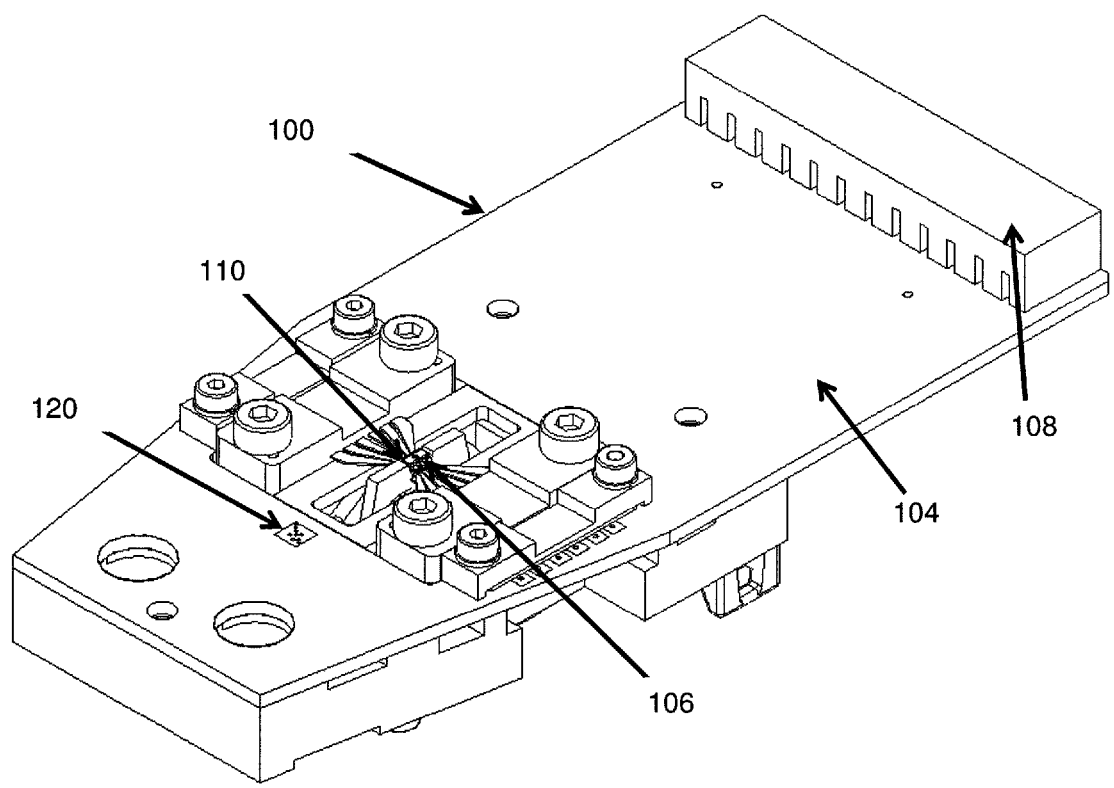
FIG. 1 shows a perspective view of a test station according to a preferred embodiment of the present invention.

FIG. 1 shows a perspective view of a test station 100 according to a preferred embodiment of the present invention. The test station 100 comprises a substrate, such as a printed circuit board 104, and a connector 108 located at one edge of the printed circuit board 104 for establishing communication with a testing module 200 (see FIG. 3). The printed circuit board 104 comprises internal electrical wiring (not shown) to electrically connect the connector 108 to a device receiving region 110 operable to receive an electronic device 106 under test, such as an integrated circuit chip. The device receiving region 110 is located generally at a center of the printed circuit board 104. The test station 100 also comprises an identification element, such as an identification tag 120, on a top surface of the printed circuit board 104 and adjacent the device receiving region 110, however it may be positioned anywhere on or in the test station 100.

Figure 2:
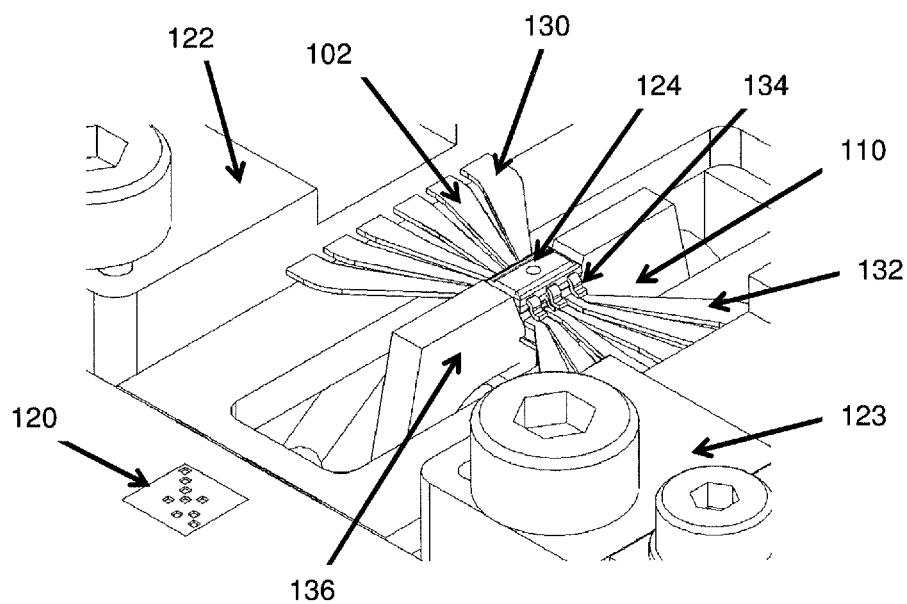
FIG. 2 shows a perspective view of a device receiving region of the test station of FIG. 1.

FIG. 2 shows a perspective view of the device receiving region 110 of the test station 100 of FIG. 1. The device receiving region 110 comprises a first contact holder 122 and a second contact holder 123 positioned on opposite sides of the device receiving region 110. A first row 130 of electrical contacts or contact strips 102 are held at their first ends by the first contact holder 122, such that the contact strips 102 extend from the first contact holder 122 with their second ends terminating at a device contact region 124 located at a center of the device receiving region 110. The identification tag 120 may be positioned adjacent to the device contact region 124.

Similarly, a second row 132 of the contact strips 102 are held at their first ends by the second contact holder 123, such that the contact strips 102 extend from the second contact holder 123 with their second ends terminating at the device contact region 124. The second ends of the first row 130 and the second row 132 of the contact strips 102 terminate proximate one another and are positioned such that each of the second ends is operable to contact a respective lead 134 of an electronic device 106 under test, such as an integrated circuit chip. When the electronic device 106 under test is placed in the device contact region 124, bottom surfaces of the leads 134 of the electronic device 106 under test contact top surfaces of the second ends of the contact strips 102. Therefore, the device contact region 124 is operable to establish electrical contact with the leads 134 of the electronic device 106 for performing tests. The internal electrical wiring of the printed circuit board 104 electrically connects the connector 108 to the contact strips 102 and the leads 134 of the electronic device 106 under test. The device receiving region 110 further comprises two opposing walls 136 to help align and position the electronic device 106 under test properly in the device contact region 124.

The identification tag 120 may comprise a visually perceptible or distinctive mark, such as a bar code, QR code or fonts and characters, which may be detected by an identification tag detector 500 (see FIG. 4), such as a camera or light sensor. The visually perceptible or distinctive identification tag 120 may be positioned on any external surfaces of the test station 100, as long as it permits detection or inspection by an appropriate identification tag detector 500. Alternatively, the identification tag 120 may comprise, for instance, an RFID tag. In that case, the identification tag 120 does not need to be visible and may be concealed within the test station 100 provided it is detectable by an RFID reader (not shown) in the vicinity. Apart from a visually distinctive mark or a RFID tag, the identification tag 120 may also comprise a contact-type identification tag, such as a touch memory.

Figure 3:
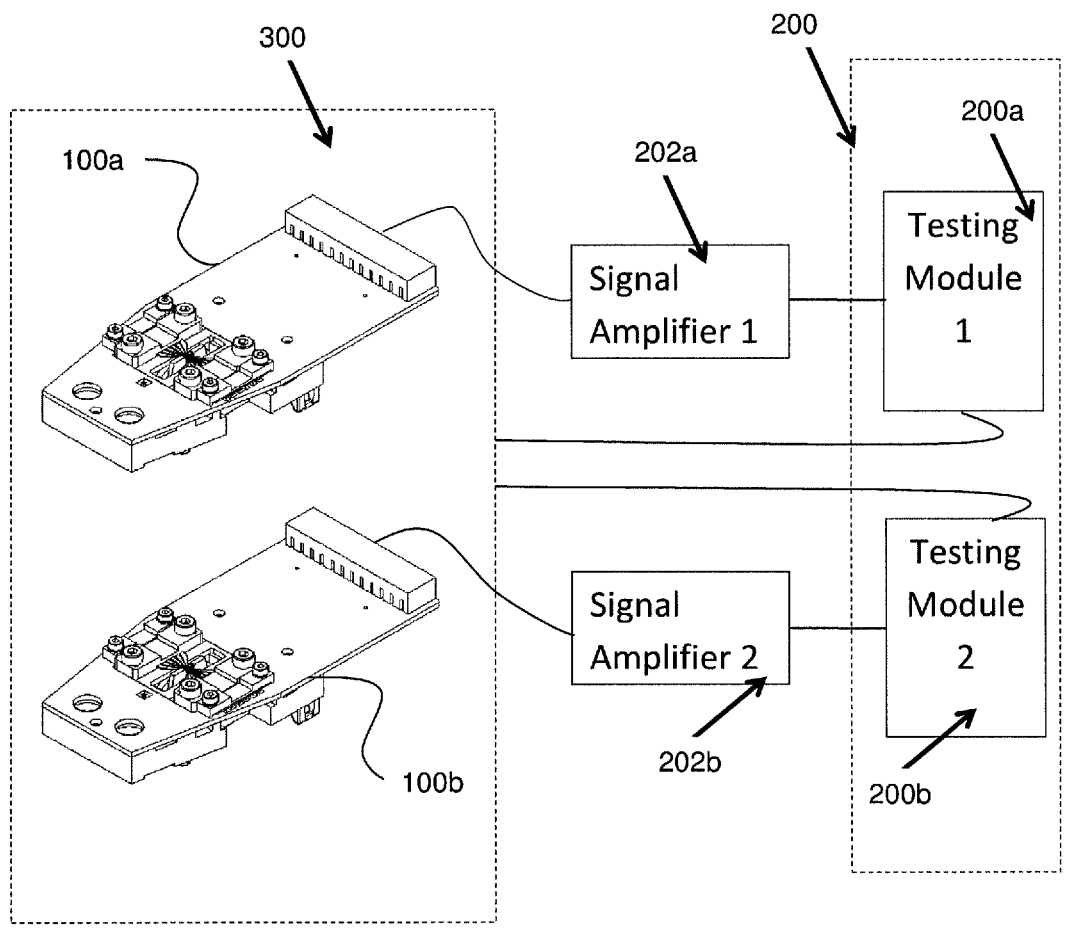
FIG. 3 shows a perspective view of two test stations that are electrically connected to two testing modules.

FIG. 3 shows a perspective view of two test stations 100a, 100b that are electrically connected to two testing modules 200a, 200b. The two test stations 100a, 100b are comprised in a test handler assembly 300. The first test station 100a may communicate with the first testing module 200a via an optional first signal amplifier 202a to amplify the signals sent. Likewise, the second test station 100b may communicate with the second testing module 200b via an optional second signal amplifier 202b. The communication between the test stations 100a, 100b, the testing modules 200a, 200b and the signal amplifiers 202a, 202b may be achieved by wired connections, for instance cables. It should be appreciated that the communication may also be wireless.

In addition, the testing modules 200a, 200b may communicate with the rest of the test handler assembly 300 by wired or wireless communication. Furthermore, the first and second testing modules 200a, 200b may alternatively comprise a single testing module 200 that is operable to communicate with several test stations 100 simultaneously. The test module 200 is in operative communication with the test stations 100a, 100b for operating test programs to test the electronic devices 106. The test handler assembly 300 may include further test stations 100, each for performing a different test on the electronic devices 106 under test. The test handler assembly 300 may, for instance, include three test stations 100, each to perform a current characteristics test, a voltage characteristics test and a resistance characteristics test respectively.

Figure 4:
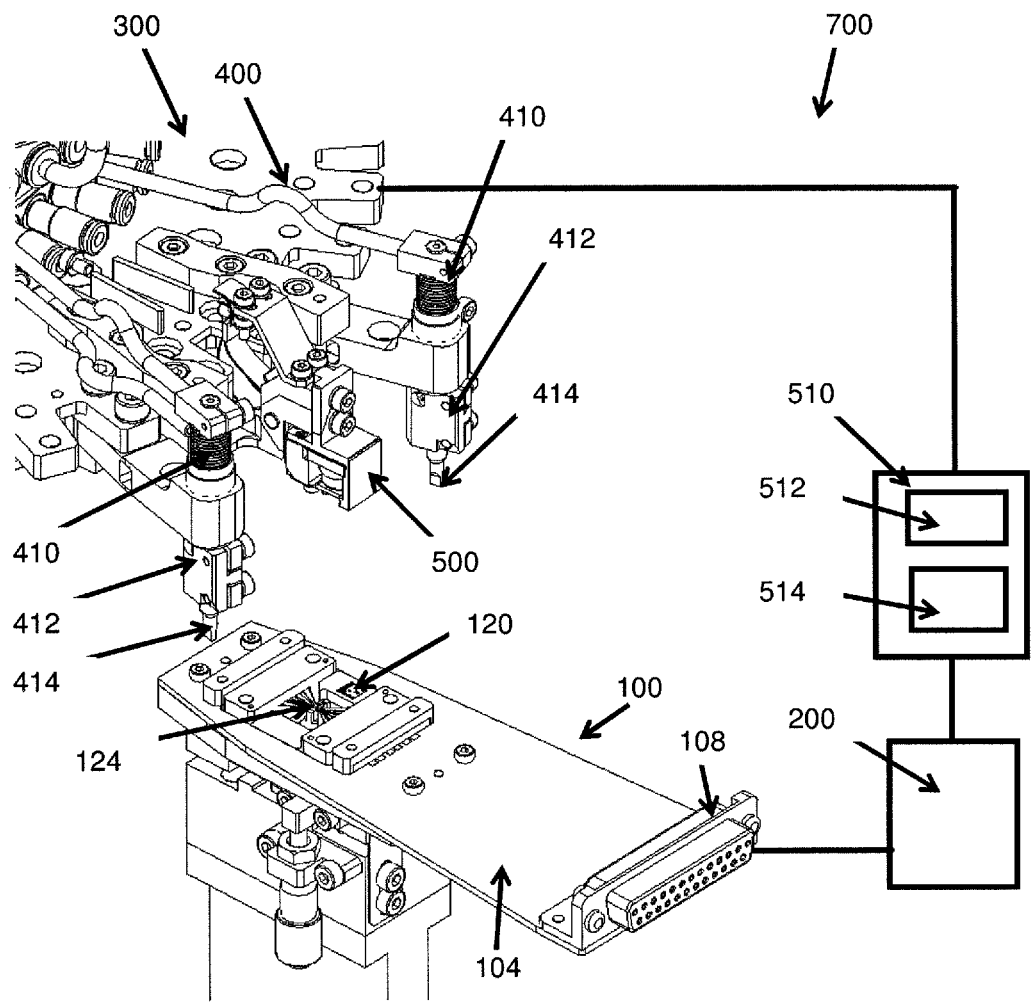
FIG. 4 shows a perspective view of a testing apparatus comprising a test handler assembly and the testing module.

FIG. 4 shows a perspective view of a testing apparatus 700 comprising the test handler assembly 300 and the testing module 200. The testing apparatus 700 is operable for testing the electronic devices 106. The test handler assembly 300 comprises the test station 100 and a rotary turret 400. The rotary turret 400 comprises a plurality of pick arms 410 equally spaced apart from each other at a circumference of the rotary turret 400. Each pick arm 410 comprises a vertically oriented elongated body 412 and a pick head 414 at a bottom end of the body 412 for picking up electronic devices 106. The pick heads 414 are operable to convey the electronic device 106 to the test station 100. The test station 100 is detachably mounted below the pick arm 410. The test station 100 is positioned such that the pick arm 410 may move downwards to place the electronic devices 106 on the device contact region 124 of the test station 100. The rotary turret 400 is operable to move the pick heads 414, which may be mounted on the rotary turret 400, relative to the location of the test station 100. The identification tag 120, which is incorporated in the test station 100, is positioned adjacent the device contact region 124. The identification element, for example the identification tag 120, is operable to indicate a characteristic of the test station 100, such as the type of test station 100 it is or the types of tests it is able to perform. Although only one test station 100 is illustrated in FIG. 4, it should be appreciated that the test handler assembly 300 typically comprises multiple detachably mountable test stations 100, each test station 100 being a different type of test station 100. For instance, the test handler assembly 300 may comprise a plurality of test stations 100, each positioned at a different location relative to the pick arms 410.

An identification tag detector 500, such as an imaging device, is positioned at the circumference of the rotary turret 400 between two adjacent pick arms 410. The rotary turret 400 is operable to move the identification tag detector 500, which may be mounted on the rotary turret 400, relative to the location of the test station 100. The identification tag detector 500 points downwards such as to be operable to detect or inspect the identification tag 120 positioned adjacent the device contact region 124 of the test station 100. The identification tag detector 500 is operable to detect or inspect the identification tag 120 and thus identify and authenticate the characteristic of the test station 100 being used. The identification tag detector 500 is operable to send the information to a computer 510 comprising a processor 512 and memory 514. The computer 510 may be incorporated or embedded in the identification tag detector 500, be an external terminal or be part of the testing module 200. The processor 512 is operable to receive the information regarding the characteristic of the test station 100 and to compare the information with system specified data for determining whether the correct test station is to be utilized for testing the electronic devices. The memory 514, for instance a memory device comprised in the computer 510, is operable to store historical processing information of the test station 100. The computer 510 is operative to check whether the identified test station 100 is of the correct type for performing a desired test on electronic devices 106 to be tested. If the correct type of test station 100 is matched to the electronic devices 106 to be tested, an appropriate test program may automatically be selected and run at the test station 100. The desired test would then be performed by the test station 100 on the electronic devices 106. However, if the test station 100 installed is found to be of an incorrect type, an alarm may be sounded to alert an operator of this error, thus preventing the losses or damage that are commonly encountered with respect to the prior art.

Further, information regarding a unique test station 100, such as the number of tests performed by the unique test station 100, may be stored in the memory 514. Such information may be useful, for instance, for determining whether the test station 100 is still within its useful lifespan or whether it is due for servicing or replacement.

Figure 5:
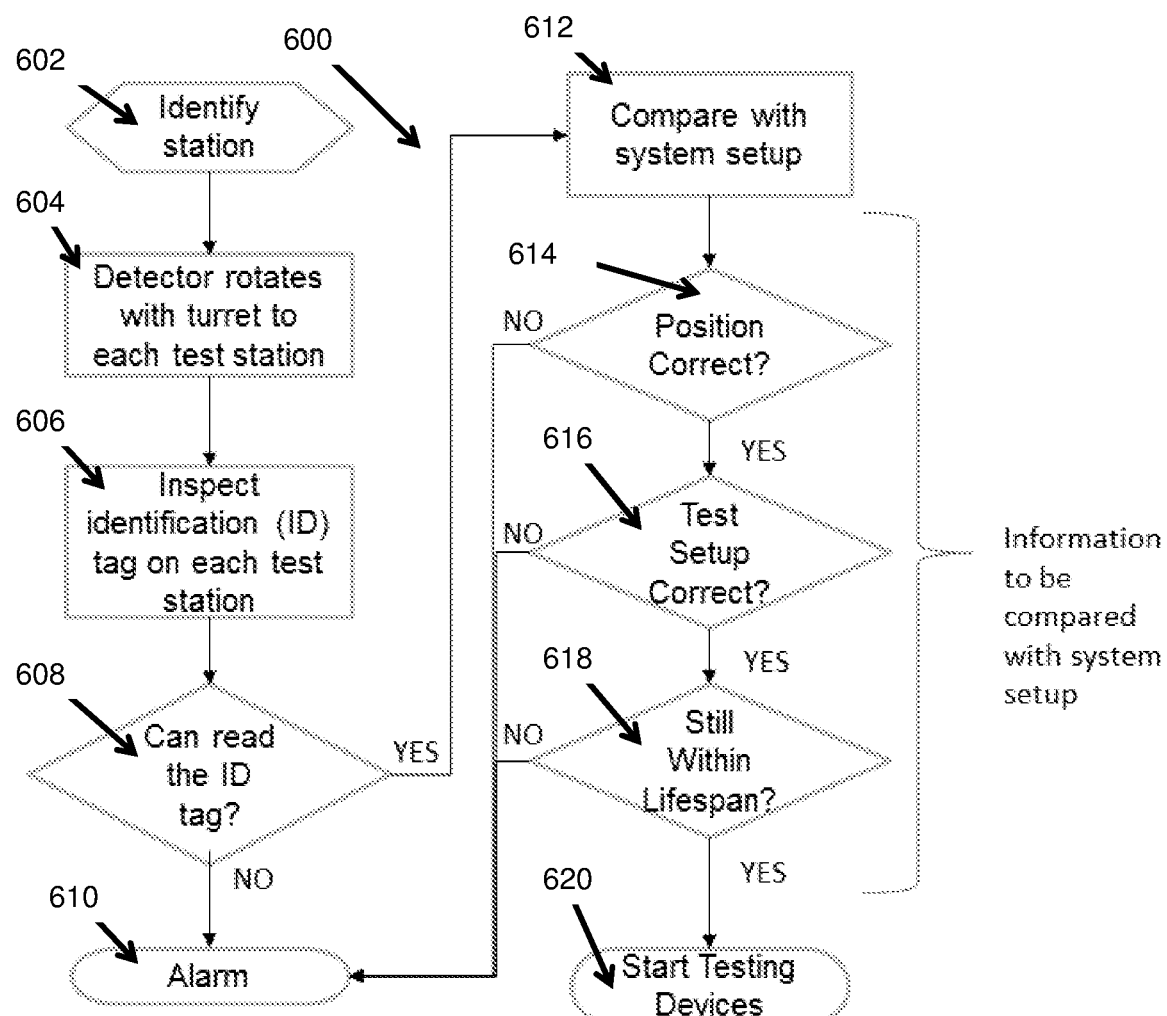
FIG. 5 is a flowchart setting out the steps involved in an exemplary process for determining whether test stations are properly installed in the testing apparatus of FIG. 4.

FIG. 5 is a flowchart setting out the steps involved in an exemplary process 600 for determining whether test stations 100 are properly installed in the testing apparatus 700 of FIG. 4. The process 600 should preferably be performed before the testing apparatus 700 starts to test the electronic devices 106 under test.

The test handler assembly 300 starts, at step 602 of the process 600, a test station identification process. The rotary turret 400, at step 604, rotates the identification tag detector 500 to each of the test stations 100 positioned below the pick arms 410 and pick heads 414. The identification tag detector 500 at step 606 detects or inspects each of the identification tags 120 on the respective test stations 100 being used. At step 608, the test handler assembly 300 determines whether the identification tags 120 can be read by the identification tag detector 500. If an identification tag 120 cannot be read, for example because it has been defaced, damaged or missing, an error signal is generated at step 610 to alert the operator. The process 600 may then terminate, to allow the operator to take appropriate remedial actions.

When the identification tags 120 are successfully read, the identification tag detector 500 sends the information to the computer 510 for checking. At step 614, the computer 510 determines whether the test stations 100 have been positioned correctly, then at step 616, the computer determines whether the test programs have been set up correctly, and finally at step 618, whether all the test stations 100 are still within their useful working lifespans. The computer 510, at steps 614, 616, 618, checks current process data against system specified data stored in the memory 514. The system specified data may, for example, indicate the respective type of test station 100 that should be installed below each of the pick arms 410, and the particular test program that should be run by each test station 100. The computer 510 may also store historical records of every test station 100 used, which may be used to determine whether any test station 100 has reached the end of its useful working lifespan.

If the results of all the determinations at steps 614, 616, 618 are positive, then the process 600 proceeds to step 620 to thereafter prompt the testing apparatus 700 to start testing the electronic devices 106. The pick heads 414 convey the electronic devices 106 to the test stations 100 for testing. However, if any of these determinations are negative, then the process 600 terminates at step 610 and an appropriate alarm would be sounded to request for operator intervention to resolve the issue detected.

Therefore, at least some of the problems of the aforementioned prior art can be avoided or at least reduced. In particular, if a wrong test station 100 is installed, the error can be detected before the test handler assembly 300 starts to test the electronic devices 106, so that any unnecessary losses or damage can be prevented. In addition, if the computer 510 automatically selects the appropriate test program, preferably based on a fixed recipe, this would eliminate the need for a human operator to manually select the correct test program from a large number of available test programs each time a test station 100 is installed or changed. The identification tag 120 also helps to determine whether or not a test station 100 has been properly installed. For example, if the identification tag 120 cannot be read by the identification tag detector 500, it would indicate that the test station 100 is installed incorrectly or misaligned. Another advantage is that the lifespan of every test station 100 can be monitored.

It should be recognized that the specifics of the various processes recited above are provided for illustrative purposes only, and that other processes and materials which provide equivalent results may be substituted therefor.

Although the present invention has been described in considerable detail with reference to certain embodiments, other embodiments are possible.

For example, instead of positioning an identification tag detector 500 on the rotary turret 400, a respective identification tag detector 500 may be placed proximate each test station 100 to detect and identify all the test stations 100 used.

Therefore, the spirit and scope of the appended claims should not be limited to the description of the embodiments contained herein.

What is claimed is:

1. A testing apparatus for testing electronic devices, the apparatus comprising:
   a plurality of detachably mountable test stations which are operative to perform tests on the electronic devices;
   a plurality of pick heads for conveying the electronic devices to at least one of the plurality of test stations for testing;
   an identification element incorporated in each test station indicating a characteristic of the test station; and
   an identification element detector movable relative to the plurality of test stations, the identification element detector being operative to identify and authenticate the characteristic of the at least one test station by detecting the identification element incorporated in the test station, prior to utilizing the test station for testing the electronic devices.

2. The apparatus of claim 1, wherein the plurality of pick heads and the identification element detector are mounted on a turret, the turret being operative to move the pick heads and the identification element detector relative to respective locations of the plurality of test stations.

3. The apparatus of claim 2, wherein the identification element detector is positioned at a circumference of the turret between two adjacent pick heads.

4. The apparatus of claim 1, wherein each of the identification elements comprises a visually distinctive mark.

5. The apparatus of claim 4, wherein the identification element detector comprises an imaging device operable to detect the visually distinctive mark.

6. The apparatus of claim 4, wherein each of the identification elements comprises a bar code or a QR code.

7. The apparatus of claim 1, wherein each of the identification elements comprises an RFID tag.

8. The apparatus of claim 1, wherein each of the test stations comprises a device contact region for establishing electrical contact with leads of the electrical devices for performing tests, and wherein each of the identification elements is positioned adjacent to the device contact region.

9. The apparatus of claim 1, further comprising a processor operable to receive information regarding the characteristic of each of the test stations and to compare the information with system specified data for determining whether the correct test station is to be utilized for testing the electronic devices.

10. The apparatus of claim 9, wherein the processor is incorporated in the identification element detector.

11. The apparatus of claim 1, further comprising a memory device for storing historical processing information of the test stations.

12. The apparatus of claim 11, wherein the memory device is incorporated in the identification element detector.

13. The apparatus of claim 1, further comprising a testing module in operative communication with each of the test station for operating a test program to test the electronic devices.

14. The apparatus of claim 13, wherein the testing module communicates with the test stations by wired communication.

15. The apparatus of claim 13, wherein the testing module communicates with the test stations by wireless communication.

16. A method for testing electronic devices, the method comprising the steps of:
   detachably mounting a plurality of test stations for performing tests on the electronic devices;
   moving an identification element detector relative to a respective identification element incorporated in each test station, each of the identification elements being indicative of a characteristic of the test station;
   detecting the identification element with the identification element detector to identify and authenticate the characteristic of the test station;
   conveying the electronic devices to at least one of the plurality of test stations with a plurality of pick heads; and thereafter
   testing the electronic devices at the at least one test station.

17. The method of claim 16, further comprising the step of generating an error signal if an incorrect type of test station is detected or an identification element is not detectable by the identification element detector.

* * * * *